United States Patent
Barchmann et al.

(10) Patent No.: US 9,190,573 B2
(45) Date of Patent: Nov. 17, 2015

(54) SEMICONDUCTOR LIGHT-EMITTING DEVICE WITH REFLECTIVE SURFACE REGION

(75) Inventors: Bernd Barchmann, Regensburg (DE); Ralph Wirth, Lappersdorf (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/348,076

(22) PCT Filed: Aug. 28, 2012

(86) PCT No.: PCT/EP2012/066689
§ 371 (c)(1),
(2), (4) Date: Mar. 28, 2014

(87) PCT Pub. No.: WO2013/045187
PCT Pub. Date: Apr. 4, 2013

(65) Prior Publication Data
US 2015/0001566 A1    Jan. 1, 2015

(30) Foreign Application Priority Data

Sep. 29, 2011    (DE) .......................... 10 2011 083 669

(51) Int. Cl.
| | |
|---|---|
| *H01L 33/46* | (2010.01) |
| *H01L 33/60* | (2010.01) |
| *H05K 1/02* | (2006.01) |
| *H01L 25/075* | (2006.01) |
| *H01L 33/62* | (2010.01) |
| *H01L 33/30* | (2010.01) |
| *F21Y 101/02* | (2006.01) |

(52) U.S. Cl.
CPC ............ *H01L 33/46* (2013.01); *H01L 25/0753* (2013.01); *H01L 33/30* (2013.01); *H01L 33/62* (2013.01); *H05K 1/02* (2013.01); *F21Y 2101/02* (2013.01); *H01L 2933/0033* (2013.01); *H01L 2933/0058* (2013.01); *H05K 2201/0355* (2013.01); *H05K 2201/10106* (2013.01); *H05K 2201/2054* (2013.01)

(58) Field of Classification Search
CPC ...... H01L 25/0753; H01L 33/62; H01L 33/60
See application file for complete search history.

(56) References Cited

U.S. PATENT DOCUMENTS 5,798,536 A * 8/1998 Tsutsui .......................... 257/99
7,586,190 B2   9/2009 Bogner et al.
(Continued)

FOREIGN PATENT DOCUMENTS

DE    10245946 C1    10/2003
DE    10245930 A1    4/2004
(Continued)

OTHER PUBLICATIONS

International Search Report issued in the corresponding PCT application No. PCT/EP2012/066689, dated Dec. 6, 2012.
(Continued)

*Primary Examiner* — Colleen A Matthews
*Assistant Examiner* — Regan J Rundio

(57) ABSTRACT

A semiconductor lighting device may include a substrate populated with at least one semiconductor light source, wherein at least one reflective surface region of the substrate is covered with a light-reflecting layer, and wherein the light-reflecting layer has an aluminum carrier coated in a reflection-intensifying manner.

13 Claims, 2 Drawing Sheets

(56) References Cited

U.S. PATENT DOCUMENTS

| | | |
|---|---|---|
| 2009/0014732 A1* | 1/2009 | Nishida et al. .................. 257/88 |
| 2010/0019264 A1* | 1/2010 | Jeong .............................. 257/98 |
| 2010/0079990 A1 | 4/2010 | Helbing |
| 2010/0200837 A1* | 8/2010 | Zimmerman et al. .......... 257/13 |
| 2010/0301731 A1 | 12/2010 | Morikawa et al. |
| 2011/0114969 A1 | 5/2011 | Lee et al. |
| 2011/0169034 A1 | 7/2011 | Tseng et al. |
| 2011/0220926 A1 | 9/2011 | Kim |
| 2013/0039013 A1 | 2/2013 | Waegli et al. |
| 2013/0223032 A1 | 8/2013 | Klein et al. |

FOREIGN PATENT DOCUMENTS

| | | |
|---|---|---|
| DE | 102010011604 A1 | 9/2011 |
| EP | 2261548 A2 | 12/2010 |
| JP | 2009037995 A | 2/2009 |
| JP | 2011014878 A | 1/2011 |
| KR | 1020080054921 A | 6/2008 |
| WO | 2012059186 A1 | 5/2012 |

OTHER PUBLICATIONS

English abstract of DE 10245946 C1 dated Oct. 23, 2003.

Office Action issued in the corresponding German application No. 102011083669.1, dated Jul. 4, 2012.

Korean Office Action of application No. 10-2014-7011646 (5 pages and 3 pages English translation) dated Apr. 28, 2015.

\* cited by examiner

SEMICONDUCTOR LIGHT-EMITTING DEVICE WITH REFLECTIVE SURFACE REGION

RELATED APPLICATIONS

The present application is a national stage entry according to 35 U.S.C. §371 of PCT application No.: PCT/EP2012/066689 filed on Aug. 28, 2012, which claims priority from German application No.: 10 2011 083 669.1 filed on Sep. 29, 2011, and is incorporated herein by reference in its entirety.

TECHNICAL FIELD

Various embodiments relate to a semiconductor lighting device, including a substrate populated with at least one semiconductor light source, wherein at least one reflective surface region of the substrate is covered with a light-reflecting layer. Various embodiments also relate to a method for producing such a semiconductor lighting device. Various embodiments can be used advantageously in particular for lighting modules, in particular in the field of general lighting.

BACKGROUND

Coupling out of light from lighting modules (in particular so-called "light engines") that typically include a substrate populated with light-emitting diodes can be limited by a deficient reflectivity of the substrate. In order to realize a high degree of coupling out of light in the case of such lighting modules, the substrate can be covered with a light-reflecting layer.

In this regard, it is known, after populating and making contact with the light-emitting diodes, to pot the substrate alongside the light-emitting diodes with silicone, wherein the silicone contains a reflective filling material such as titanium oxide. In this case, problems often arise on account of contamination of emission surfaces of the light-emitting diodes by silicone spatter and light losses caused thereby. Furthermore, a deficient wetting of specific substrate regions can occur depending on a surface roughness and surface energy. Moreover, specific regions may be wetted to a great extent and the silicone may "creep up" on walls and electrical lines (e.g. bonding wires) of the light-emitting diodes onto the emitter area, particularly when flat LED chips are used.

Use of a large-area silver layer as a light-reflecting layer is also known, which layer, however, has to be protected against corrosion ("tarnish") and migration.

SUMMARY

Various embodiments provide in particular a lighting device, in particular a lighting module, having an improved light-reflecting layer.

Various embodiments provide a semiconductor lighting device, including a substrate populated with at least one semiconductor light source, wherein at least one surface region (called "reflective surface region" hereinafter) of the substrate is covered with a light-reflecting layer, and wherein the light-reflecting layer has an aluminum carrier coated in a reflection-intensifying manner.

An aluminum carrier coated in a reflection-intensifying manner can be configured as highly reflective and is moreover reliably protected against environmental influences by its at least one reflection-intensifying coating.

The aluminum carrier can be, in particular, a highly reflective thin aluminum sheet (in particular having a thickness of between 0.1 mm and 0.8 mm) or an aluminum foil (in particular having a thickness of less than 0.1 mm).

The aluminum carrier coated in a reflection-intensifying manner can be applied to the substrate by means of a coating process or can be provided as an independent part and subsequently applied to the substrate.

Such an aluminum carrier coated in a reflection-intensifying manner can be, for example, an aluminum carrier from the company Alanod, in particular from the product series "MIRO". The reflective surface region can therefore be, in particular, a MIRO-coated or MIRO-covered region of the substrate.

In order to enable a particularly high luminous efficiency, it is preferred for the aluminum carrier coated in a reflection-intensifying manner to have a silver layer between the aluminum carrier and the at least one reflection-intensifying layer. Such an aluminum carrier coated in a reflection-intensifying manner can be, for example, an aluminum carrier from the company Alanod, in particular from the product series "MIRO SILVER". The reflective surface region can therefore be, in particular, a MIRO SILVER-coated or MIRO SILVER-covered region of the substrate.

Preferably, the at least one semiconductor light source includes at least one light-emitting diode. When a plurality of light-emitting diodes are present, they can emit light in the same color or in different colors. A color can be monochromatic (e.g. red, green, blue, etc.) or multichromatic (e.g. white). Moreover, the light emitted by the at least one light-emitting diode can be an infrared light (IR LED) or an ultraviolet light (UV LED). A plurality of light-emitting diodes can generate a mixed light; e.g. a white mixed light. The at least one light-emitting diode can contain at least one wavelength-converting phosphor (conversion LED). Alternatively or additionally, the phosphor can be arranged in a manner remote from the light-emitting diode ("remote phosphor"). The at least one light-emitting diode can be present in the form of at least one individually housed light-emitting diode or in the form of at least one LED chip. A plurality of LED chips can be mounted on a common substrate ("submount"). The at least one light-emitting diode can be equipped with at least one dedicated and/or common optical unit for beam guiding, e.g. at least one Fresnel lens, collimator, and so on. Instead of or in addition to inorganic light-emitting diodes, e.g. based on InGaN or AlInGaP, generally organic LEDs (OLEDs, e.g. polymer OLEDs) can also be used. Alternatively, the at least one semiconductor light source may include e.g. at least one diode laser.

The substrate can be, for example, a printed circuit board (e.g. FR4, metal-core circuit board, etc.) or a ceramic carrier.

In one configuration, the at least one semiconductor light source is applied on the at least one reflective surface region. This facilitates production because the aluminum carrier coated in a reflection-intensifying manner can be applied to the substrate over a large area and, in particular, without or without frequent cutouts.

However, the at least one semiconductor light source can alternatively be applied at cutouts of the reflective surface region on the substrate, such that the reflective surface region is situated laterally with respect to the at least one semiconductor light source.

In another configuration, the at least one semiconductor light source has an electrically insulating underside. Such a semiconductor light source can be applied without further measures and with simple means at basically any desired location on a reflective surface region or some other surface region of the substrate. In particular, neither an electrically insulating layer nor an electrically conductive layer need be provided between the semiconductor light source and the reflective surface region. By way of example, such a semiconductor light source can be adhesively bonded by means of an adhesive, e.g. a double-sided adhesive tape, a liquid adhesive or a thermally conductive paste, etc., onto the reflective surface region or the aluminum carrier thereof coated in a reflection-intensifying manner. Such a semiconductor light source typically has two contact locations on the top side for the purpose of electrical contact-making.

In another configuration, the semiconductor lighting device includes at least one supply line fitted on the substrate and serving for supplying the at least one semiconductor light source with electrical signals, wherein the at least one supply line is situated outside the at least one reflective surface region. This enables the substrate to be covered in a simple manner in terms of production engineering and largely mutually independently with at least one aluminum carrier coated in a reflection-intensifying manner and (separately therefrom) with the at least one supply line. In particular semiconductor light sources having contact locations only on the top side can be mounted by means of this configuration. A supply line can be, in particular, a conductor track, if appropriate with at least one associated contact zone, etc.

In one configuration, furthermore, the at least one semiconductor light source is a volume emitter. In a volume emitter, the active part extends significantly in all directions (that is to say is comparatively thick), wherein typically only part of the light (approximately 50%) emerges from the emitter area at the top side and otherwise emerges laterally, for example. A semiconductor light source on the basis of a volume emitter usually has an electrically insulated underside and electrical contacts at the top side. However, a surface emitter can also have an electrically insulated underside and electrical contacts at the top side.

In one configuration, moreover, the semiconductor lighting device includes at least one supply line fitted on the substrate and serving for supplying the at least one semiconductor light source with electrical signals, wherein the at least one supply line is applied over an insulating layer on the at least one reflective surface region. As a result, in particular, electrical contact can be made, in a simple manner, with semiconductor light sources which have a first electrical contact on the underside (i.e. on their bearing surface). In particular, it is thus also possible to avoid introducing cutouts into the aluminum carrier coated in a reflection-intensifying manner and/or applying a plurality of comparatively small aluminum carriers. However, it is also possible for the supply line(s) to be applied directly to the substrate, also without a dedicated insulating layer in the case of a substrate having an electrically insulating surface.

A second electrical contact is typically situated on a top side of the semiconductor light source, but it may, in principle, likewise be arranged on the underside. A supply line can be, in particular, a conductor track, if appropriate with at least one associated contact zone, etc.

In one configuration, moreover, the semiconductor lighting device includes at least one semiconductor light source having an electrical contact at its underside, wherein the electrical contact bears on an electrically conductive supply line. Such a semiconductor light source can have, in particular, an active part in which typically at least a large portion of the light (>80%) is emitted from an emitter area at the top side (surface emitter). Such a semiconductor light source can be, in particular, a thin-film LED (e.g. on the basis of a so-called "thin-GaN").

In yet another configuration, the insulating layer projects laterally beyond the respective supply line, and the laterally projecting part of the insulating layer, at least in regions, and/or the at least one supply line, at least in sections, are/is covered by a reflective potting compound. In this regard, a reflective surface of the substrate can be enlarged and a luminous efficiency can thus be improved.

In one configuration, moreover, the reflective potting compound is polymer, in particular silicone or mixtures thereof, which includes a (diffusely) reflective filling material, in particular titanium oxide, barium sulfate, tin oxide, zinc oxide, etc. As a result of the titanium oxide, the silicone becomes white or whitish and then constitutes a diffuse reflection material. However, other materials can also be used, and also specularly reflective filling materials or potting compound provided with small inclusions, etc. The potting compound is not restricted to silicone.

In another configuration, the substrate is a plate-shaped substrate. The basic shape of the plate-shaped substrate can be for example circular or angular, e.g. square, in plan view. The substrate can be populated on one side or on both sides.

In a further configuration, the semiconductor lighting device is a lighting module, in particular for incorporation into a luminaire or a luminaire system.

Various embodiments also provide a method for producing a semiconductor lighting device, wherein the method includes at least the following steps: providing a substrate; coating at least one reflective surface region of the substrate with an aluminum carrier coated in a reflection-intensifying manner; and populating the substrate with at least one semiconductor light source.

This method can be configured analogously to the lighting device described above and has the same advantages.

In this regard, in one configuration, populating includes placing the at least one semiconductor light source substantially directly (i.e. in particular without a dedicated insulating layer and/or supply line, but if appropriate with an adhesive) onto a reflective surface region. The semiconductor light source can be a volume emitter, in particular.

In another configuration, populating is preceded by: coating a part of the reflective surface region with an insulating material and coating the insulating material with electrically conductive material in order to produce at least one electrical supply line. Furthermore, a step of mounting at least one semiconductor light source that makes contact on the underside onto at least one electrical supply line can be present. The semiconductor light source can be a surface emitter, in particular.

The order of the method steps is not restricted to the order described above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
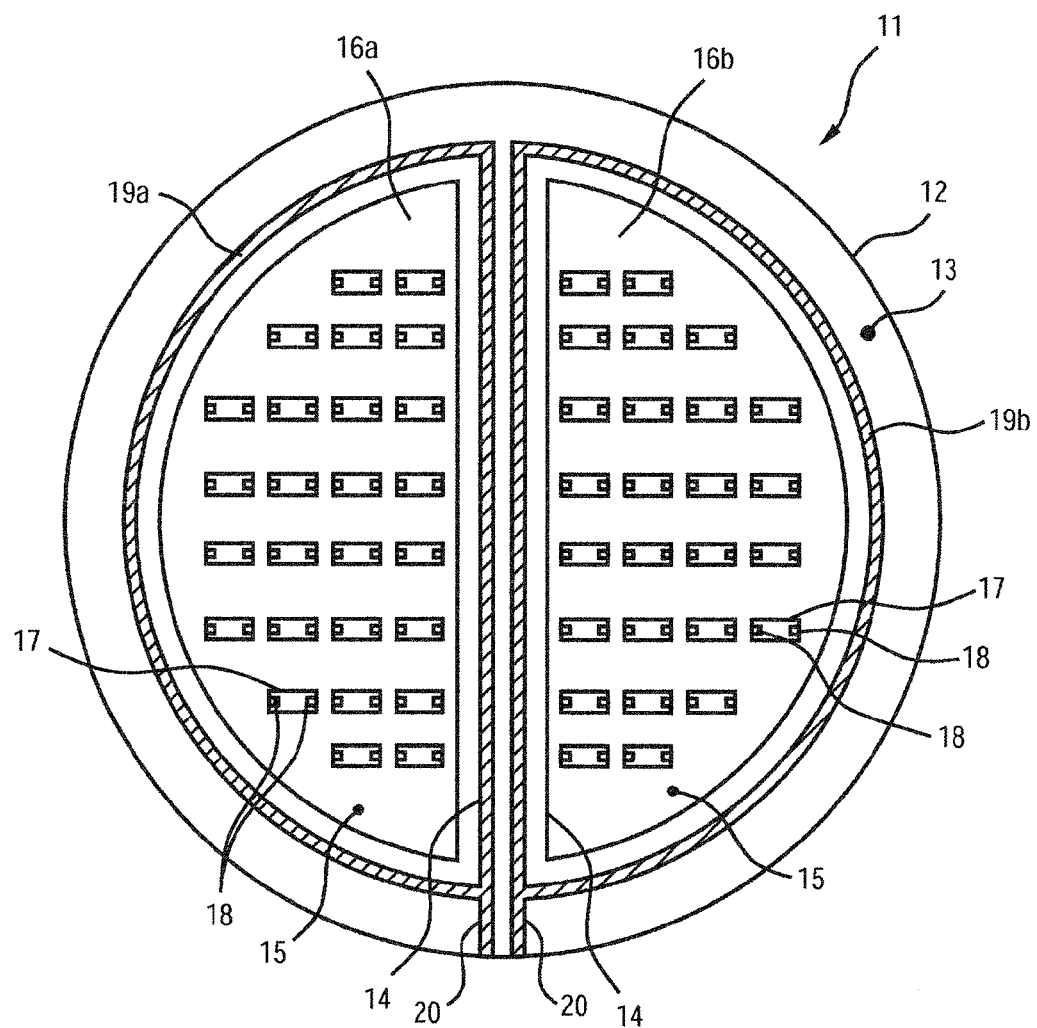
FIG. 1 shows in plan view a semiconductor lighting device in accordance with a first embodiment.

FIG. 1 shows in plan view a semiconductor lighting device in the form of an LED module 11 in accordance with a first embodiment. The LED module 11 includes a circular, plate-like substrate 12, e.g. a printed circuit board. A shown top side 13 of the substrate 12 is covered with two semicircular light-reflecting layers 15 situated opposite one another mirror-symmetrically along their straight sides 14. The light-reflecting layers 15 are configured as aluminum carriers coated in a reflection-intensifying manner.

The light-reflecting layers 15 are spaced apart from one another and define respective reflective surface regions 16a, 16b. The reflective surface regions 16a, 16b are covered by free substrate 12 on all sides.

A plurality of semiconductor light sources in the form of light-emitting diodes 17 are adhesively bonded directly on each of the reflective surface regions 16a, 16b. The light-emitting diodes 17 each have a volume emitter for emitting light and are electrically insulated at their underside. Electrical contact can be made with a light-emitting diode 17 by means of two associated contact zones 18 on the top side. The contact zones of the light-emitting diodes 17 can be electrically connected to one another and to one or two supply lines in the form of conductor tracks 19a, 19b, in particular via bonding wires or the like (not illustrated).

The conductor tracks 19a, 19b serve for electrically supplying the light-emitting diodes 17, surround a respective reflective surface region 16a, 16b on all sides (that is to say are present outside the reflective surface regions 16a, 16b) and each have a contact-making projection 20. By way of example, a potential difference can be applied to the contact-making projections 20, wherein for example the voltage or a current can be used as a reference variable.

As a result of the separate application of the light-reflecting layers 15 and of the conductor tracks 19a, 19b, in the case of an electrically insulating surface of the substrate 12, a dedicated insulating layer can be dispensed with. Moreover, the light-reflecting layers 15 can be applied to the substrate 12 as closed areas.

The LED module 11 can furthermore be potted, e.g. with a transparent or diffuse potting compound.

Figure 2:
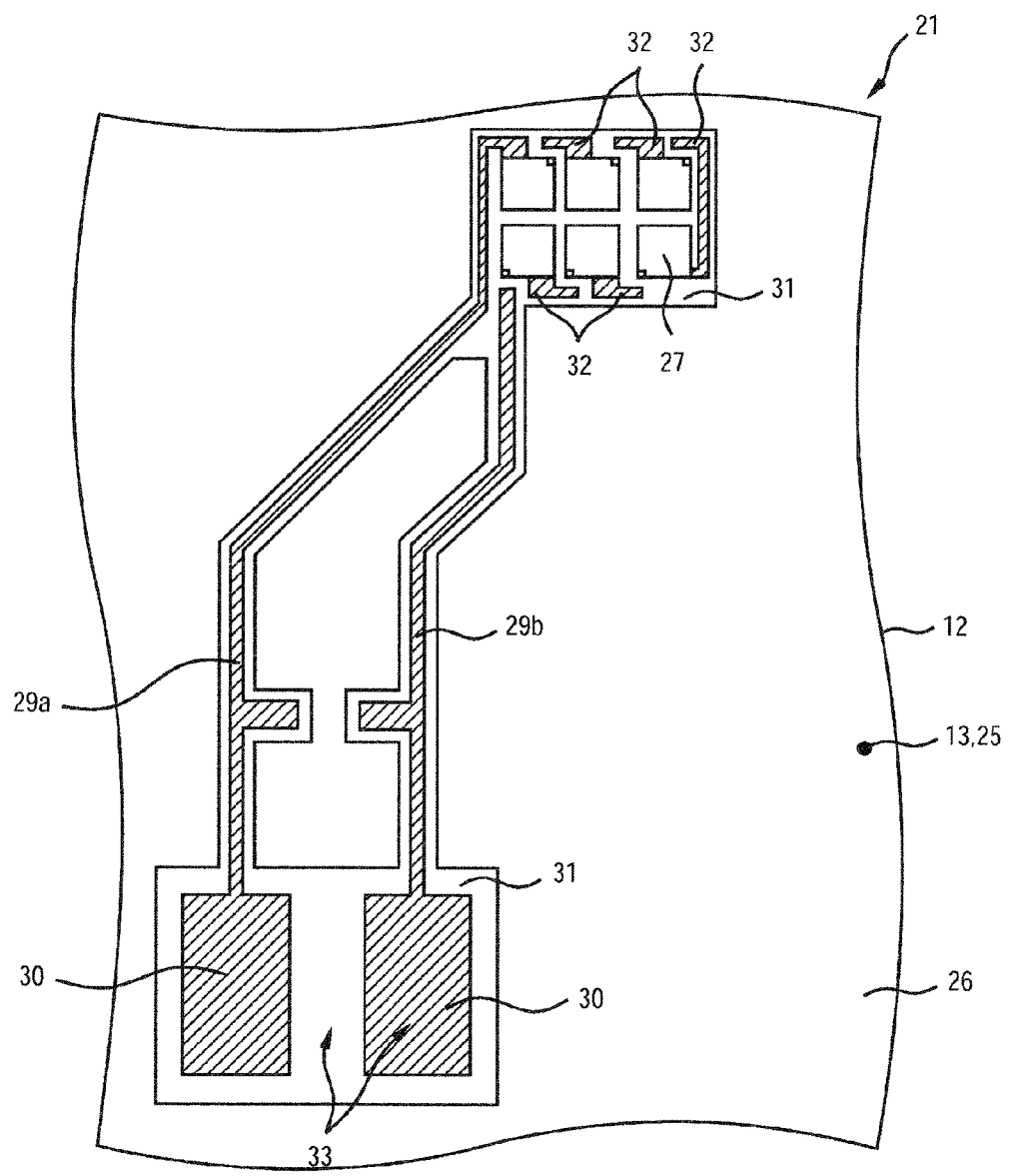
FIG. 2 shows in plan view an excerpt from a semiconductor lighting device in accordance with a second embodiment.

FIG. 2 shows in plan view an excerpt from a semiconductor lighting device 21 in accordance with a second embodiment. The semiconductor lighting device 21 includes a substrate 12, one surface 13 of which is covered substantially over the whole area by a light-reflecting layer 25 in the form of an aluminum carrier coated in a reflection-intensifying manner (e.g. MIRO or MIRO SILVER) and, consequently, the reflective surface region 26 can at least substantially correspond to an entire side of the substrate 12. Such a covering of the substrate 12 can be implemented in a particularly simple manner.

The semiconductor sources are present here as light-emitting diode chips 27 using thin-film technology (e.g. thin-GaN), the underside of which corresponds to an electrical connection and the top side of which corresponds to a further electrical connection. For the purpose of making electrical contact with the LED chips 27, two electrical supply lines 29a, 29b are present here, which have been applied over an electrical insulating layer 31 on the light-reflecting layer 25. The insulating layer 31 projects laterally beyond the respective supply line 29a, 29b.

At one end the supply lines 29a, 29b transition into a respective contact zone 30 for making electrical contact with an external current or voltage source. At the other end, via bonding wires (not illustrated) and electrically conductive connecting lines 32 (which likewise constitute supply lines) a connection to the LED chips 27 can be produced, which chips can be electrically connected in series, for example. For this purpose, the underside of the LED chips 27 bears on the supply line 29a or on one of the connecting lines 32, which are both embodied as conductor tracks which can be extended below an LED chip 27 in particular in the form of a contact zone.

Typically, the electrical supply lines 29a, 29b and 32 are not significantly reflective. In order to increase a luminous efficiency, that part of the insulating layer 31 which projects laterally beyond the supply lines 29a, 29b and 32 and the supply lines 29a, 29b and 32 are covered by a reflective potting compound 33. The potting compound 33 can be silicone, in particular, which includes a reflective filling material, in particular titanium oxide.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

11 LED module
12 Substrate
13 Top side
14 Straight side
15 Light-reflecting layer
16a Reflective surface region
16b Reflective surface region
17 Light-emitting diode
18 Contact zone
19a Conductor track
19b Conductor track
20 Contact-making projection
21 Semiconductor device
22 Light-reflecting layer
23 Reflective surface region
24 Light-emitting diode chip
29a Supply line
29b Supply line
30 Contact zone
31 Insulating layer
32 Connecting lines
33 Potting compound

The invention claimed is:

1. A semiconductor lighting device, comprising:
a substrate having at least one reflective surface region covered with a light-reflecting layer,
at least one semiconductor light source populating the substrate; at least one insulating layer on the at least one reflective surface layer; and
at least one supply line applied over the at least one insulating layer,
wherein the light-reflecting layer has an aluminum carrier coated in a reflection-intensifying manner; and
wherein the insulating layer projects laterally beyond the respective supply line, and the laterally projecting part of the insulating layer is at least partially covered by a reflective potting compound.

2. The semiconductor lighting device as claimed in claim 1, wherein the at least one semiconductor light source is applied on the at least one reflective surface region.

3. The semiconductor lighting device as claimed in claim 1, wherein the at least one semiconductor light source has an electrically insulating underside.

4. The semiconductor lighting device as claimed in claim 3, further comprising at least one supply line fitted on the substrate and serving for supplying the at least one semiconductor light source with electrical signals, wherein the at least one supply line is situated outside the at least one reflective surface region.

5. The semiconductor lighting device as claimed in claim 3, wherein the at least one semiconductor light source is a volume emitter or a top emitter.

6. The semiconductor lighting device as claimed in claim 1, further comprising at least one semiconductor light source having an electrical contact at its underside, wherein the electrical contact bears on an electrically conductive supply line.

7. The semiconductor lighting device as claimed in claim 1, wherein the reflective potting compound is polymer, which comprises a reflective filling material.

8. The semiconductor lighting device as claimed in claim 7, wherein the reflective potting compound is silicone.

9. The semiconductor lighting device as claimed in claim 7, wherein the reflective filling material is titanium oxide.

10. The semiconductor lighting device as claimed in claim 1, wherein the substrate is a plate-shaped substrate.

11. The semiconductor lighting device as claimed in claim 1, wherein the semiconductor lighting device is a lighting module.

12. A method for producing a semiconductor lighting device, the method comprising:
    providing a substrate;
    coating at least one reflective surface region of the substrate with an aluminum carrier coated in a reflection-intensifying manner;
    coating a part of the reflective surface region with an insulating material;
    coating the insulating material with electrically conductive material in order to produce at least one electrical supply line; and thereafter populating the substrate with at least one semiconductor light source.

13. The method as claimed in claim 12, wherein populating comprises placing the at least one semiconductor light source substantially directly onto a reflective surface region.

\* \* \* \* \*